July 31, 1962 B. DANKER 3,047,813
RECEIVING CIRCUIT ARRANGEMENT COMPRISING A RATIO DETECTOR
Filed Nov. 27, 1959
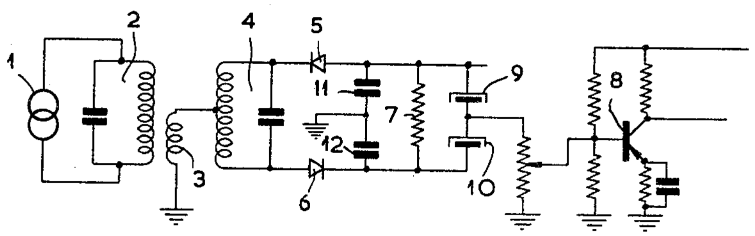
INVENTOR
BEREND DANKER
BY [signature]
AGENT United States Patent Office 3,047,813

Patented July 31, 1962

3,047,813

RECEIVING CIRCUIT ARRANGEMENT COMPRISING A RATIO DETECTOR

Berend Danker, Eindhoven, Netherlands, assignor to North American Philips Company, Inc., New York, N.Y., a corporation of Delaware Filed Nov. 27, 1959, Ser. No. 855,684
Claims priority, application Germany Jan. 28, 1959
1 Claim. (Cl. 329—129)

The invention relates to a receiving circuit arrangement comprising a symmetrical ratio detector and a low-frequency amplifier comprising transistors. A symmetrical ratio detector has, in general, the advantage that the required insensitivity to amplitude modulation is obtained in a convenient and simple manner. In the conventional, tube-equipped arrangements of this kind the low-frequency signal is obtained from a circuit point, where the detector current flows through the detector resistors. These detector resistors usually have a value of at least a few kohm, for example between 4.7 and 33 kohm. In transistor-equipped amplifiers significant detector losses thus occur owing to the low input impedance of such an amplifier.

The invention has for its object to reduce or to suppress this loss and is characterized in that the charging capacitor of the symmetrical ratio detector consists of the series combination of two capacitors and in that the junction of these capacitors is connected to the input electrode of the low-frequency transistor amplifier.

The invention will now be described more fully with reference to the drawing. The oscillations to be detected, originating from a current source 1, are fed to a circuit 2, tuned to these oscillations and coupled rigidly with a coil 3 and substantially critically with a second circuit 4, also tuned to the oscillations to be detected. The circuit 4 is followed by two rectifiers 5 and 6 of opposite conductivity, which are connected with each other through a resistor 7, which is shunted by a capacitor. The capacitor has a lower impedance for the frequency of the detected oscillation than the resistor 7.

The detected oscillation is usually obtained, for example, from a central tapping of the resistor 7. However, if the detector is followed by a low-frequency transistor amplifier such as transistor 8, high detector losses would occur, since the internal input impedance of the transistor 8 is low as compared with that of the resistor 7. In accordance with the invention the resistor 7 is therefore shunted by the series combination of two capacitors 9 and 10, the junction of which is connected to the base of the transistor 8. The junction of the detector capacitors 11 and 12 is connected to ground.

In a practical embodiment of a ratio detector for medium-frequency oscillations of 10.7 mc./s., the following values of the circuit elements were employed:

Rectifiers 5 and 6 of the type OA 79,
Resistor 7, 39 kohm,
Capacitors 9 and 10, each 10 $\mu$f.,
Capacitors 11 and 12, each 270 pf.

What is claimed is:

A symmetrical ratio detector comprising, a source of modulated carrier waves, a tuned circuit coupled to said source, a pair of rectifier elements coupled in opposite polarities to the respective ends of said tuned circuit, a first pair of capacitors connected in series across said rectifier elements, means connecting the junction of said first pair of capacitors to a point of constant potential, a resistor connected across said rectifier elements, and a second pair of capacitors also connected across said rectifier elements, each of said second pair of capacitors having a capacitance substantially greater than that of each of said first pair, and means connecting the junction of said second pair of capacitors to the input of a low-frequency transistor amplifier.

References Cited in the file of this patent

UNITED STATES PATENTS

| | | |
|---|---|---|
| 2,497,841 | Seeley | Feb. 14, 1950 |
| 2,528,182 | Sands et al. | Oct. 31, 1950 |

FOREIGN PATENTS

| | | |
|---|---|---|
| 1,123,588 | France | June 11, 1956 |